United States Patent [19]
Jernakoff

[11] Patent Number: 4,465,982
[45] Date of Patent: Aug. 14, 1984

[54] PHASE-LOCKED LOOP WITH REDUCED FREQUENCY MODULATION

[75] Inventor: George Jernakoff, Albany, N.Y.

[73] Assignee: General Electric Company, Schenectady, N.Y.

[21] Appl. No.: 349,955

[22] Filed: Feb. 18, 1982

[51] Int. Cl.³ .............................................. H03L 7/18
[52] U.S. Cl. .................................... 331/1 A; 331/8; 331/14; 331/17; 331/25
[58] Field of Search ...................... 331/1 A, 8, 17, 14, 331/25

[56] References Cited

U.S. PATENT DOCUMENTS

| | | | |
|---|---|---|---|
| 4,118,674 | 10/1978 | Ball | 331/17 |
| 4,339,731 | 7/1982 | Adams | 331/1 A |
| 4,387,348 | 6/1983 | Fritze | 331/17 |

FOREIGN PATENT DOCUMENTS 18131 1/1982 Japan ..................................... 331/17

*Primary Examiner*—Siegfried H. Grimm
*Assistant Examiner*—David C. Mis
*Attorney, Agent, or Firm*—Geoffrey H. Krauss; James C. Davis, Jr.; Marvin Snyder

[57] ABSTRACT

A phase-locked loop provides an output frequency, locked to a multiple N of a reference frequency, responsive to a frequency-control voltage supplied to the output-frequency-generating voltage-controlled oscillator from the output of a differential amplifier. The differential amplifier inputs are provided with voltages sampled from the output of a pair of integrators respectively enabled for integration during complementary, and substantially identical, portions of the phase detector output waveform. Output-frequency-control voltage ripple is substantially reduced, with concomitant reduction of frequency modulation of the output frequency, over the reference frequency period.

14 Claims, 12 Drawing Figures

PHASE-LOCKED LOOP WITH REDUCED FREQUENCY MODULATION

BACKGROUND OF THE INVENTION

The present invention relates to phase-locked loops and, more particularly, to a novel phase-locked loop having greatly reduced frequency modulation of the output frequency waveform over the period of the synchronizing lower reference frequency waveform.

Phase-locked loops are typically utilized to generate a higher-frequency output waveform synchronized to a lower-frequency reference waveform. The higher-frequency waveform, typically generated by a voltage-controlled oscillator, is frequency-divided by some factor N to provide a counted-down frequency equal to the reference frequency. The two frequencies are phase detected to derive a frequency-error signal. The frequency-error signal from the phase detector output must be filtered, typically with a capacitor external to the phase detector, in order to reduce the phase detector output ripple and minimize frequency modulation of the locked oscillator. If a relatively high order of frequency division N is utilized, a small amount of phase detector output ripple will result in a relatively large degree of locked-oscillator frequency modulation. Often, the amount of oscillator frequency modulation is unacceptable. Hitherto, the phase detector output filter capacitance has been increased to reduce the degree of this frequency modulation, although there is a practical limit to the magnitude of the filter capacitance. A filter capacitor having too large a capacitance value tends to cause the loop to become underdamped and have a tendency to oscillate, while the lock-in range of the loop becomes very small and renders synchronization to a reference signal difficult, if not impossible. It is therefore highly desirable to operate on the phase detector output waveform (typically a square wave at twice the frequency of the reference input, at lock or near-lock conditions) to reduce the degree of controlled oscillator frequency modulation, while avoiding the synchronization and stability problems typically presented by a large filter capacitance at the phase detector output.

BRIEF SUMMARY OF THE INVENTION

In accordance with the invention, a phase-locked loop having reduced frequency modulation of the output of a voltage-control oscillator, which oscillator output frequency is divided by a factor N to provide a counted-down frequency for comparison to a reference frequency and a phase detector, utilizes: first and second integrators respectively reset at the positive-going and negative-going edges of the reference frequency waveform and each providing an integrated ramp voltage present for approximately the first or third one-quarter portions of the reference frequency waveform interval. The first and second integrator ramp waveforms are sampled at times one-quarter of the detector waveform cycles after the start of the associated ramp, as established by the positive and negative-going transitions of the counted-down control oscillator waveform, substantially in phase quadrature with the transitions of the reference frequency waveform. The sampled ramp voltages are applied to a differential amplifier, having the output thereof connected to a frequency control input of the oscillator, for correcting the oscillator frequency responsive to oscillator frequency drift or changes in the reference waveform frequency.

In one presently preferred embodiment, each integrator means includes an integrating capacitance into which a substantially constant current is gated to provide the ramp. Semiconductor switches are provided for resetting the integrating capacitor and for connecting each integrating capacitor to an associated sampling capacitor. Logic control means are provided for generating resetting and sampling strobe signals for each of the first and second integration-and-sample sections, responsive to the phase detector output waveform, which contains transitions at each of the transitions of the counted-down frequency and reference frequency waveforms.

It is therefore one object of the present invention to provide a novel phase-locked loop in which large phase detector output voltage variations are eliminated, to reduce the resulting magnitude of frequency modulation of the loop output frequency.

This and other objects of the present invention will become apparent upon consideration of the following detailed description, when read in conjunction with the drawings.

DETAILED DESCRIPTION OF THE INVENTION

Figure 1:
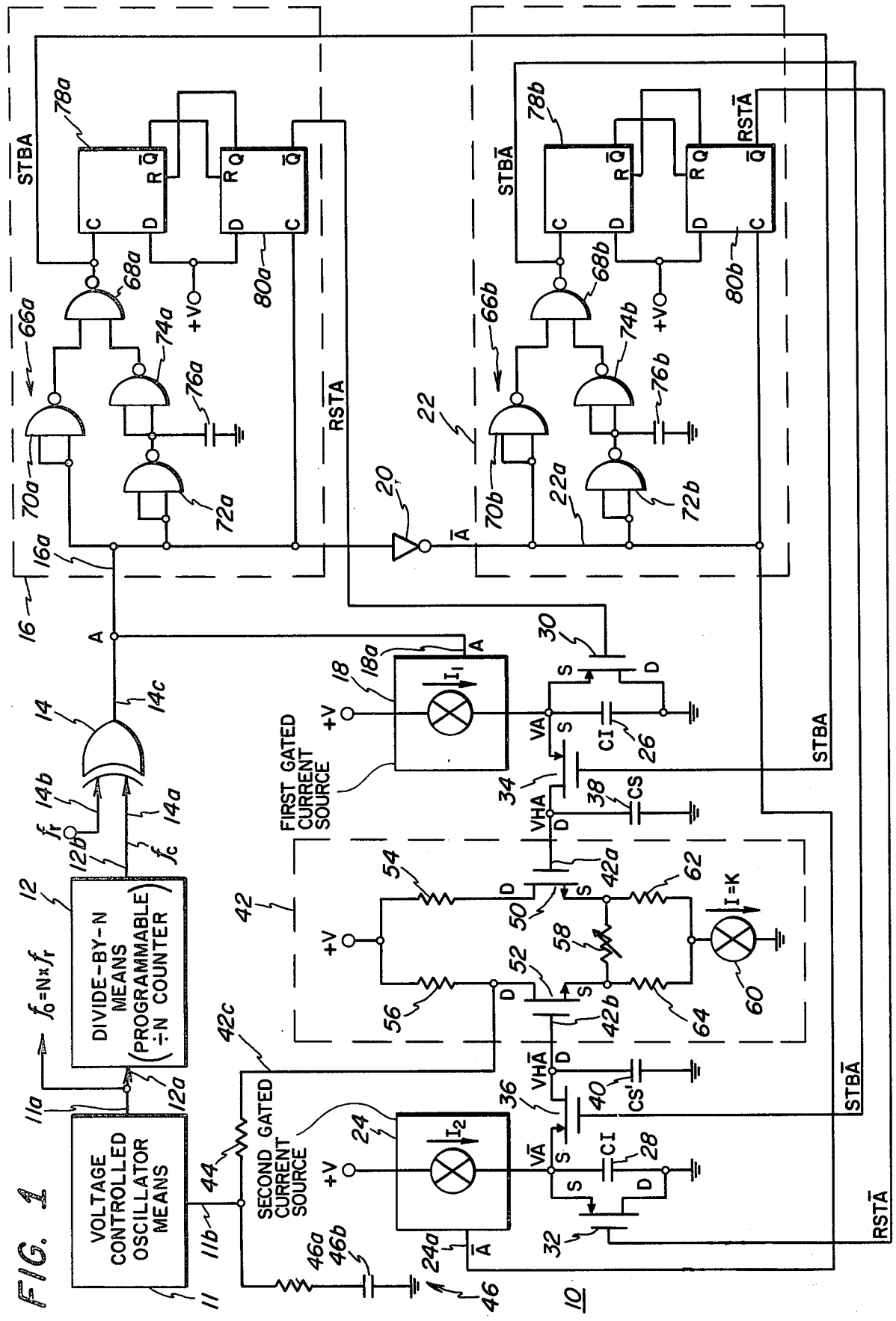
FIG. 1 is a schematic block diagram of a presently preferred embodiment of my novel phase-locked loop, in accordance with the principles of the present invention.
Figure 1A:
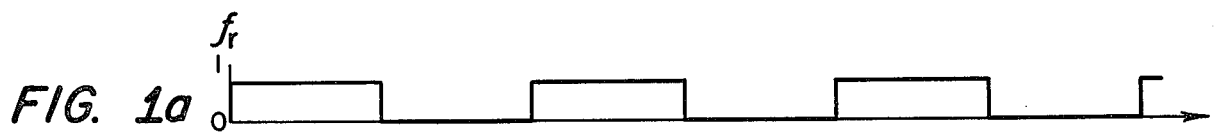
FIGS. 1a-1k are coordinated graphs of waveforms occurring at the various points in the circuit of FIG. 1, and useful in understanding operation thereof.

Referring to the Figures, a presently preferred embodiment of my novel phase-locked loop 10, includes a voltage-controlled oscillator means 11 having an output 11a at which an output frequency $f_0$ waveform is provided, with instantaneous frequency related to the instantaneous magnitude of a control voltage provided at a control input 11b. The loop output frequency $f_0$ is a multiple N of a loop reference frequency $f_r$, i.e. $f_0 = N \times f_r$. The oscillator output frequency $f_0$ is divided by the muliplication factor N in a divide-by-N means 12, such as a programmable divide-by-N counter and the like, having a counting input 12a connected to the oscillator means output 11a and having an output 12b at which a counted-down frequency $f_c$ binary waveform appears. The divider means output 12b is connected to one input 14a of a phase detector 14, such as may be provided by the use of an exclusive-OR (XOR) gate and the like. A remaining input 14b receives the reference frequency $f_r$ binary waveform (FIG. 1a). The reference frequency binary waveform and the divider means output binary waveform (FIG. 1b) are, when the loop is locked, in phase quadrature, and the waveform A (FIG. 1c) at the phase detector output 14c is a square wave at twice the frequency of the counted or reference waveforms.

Detector output 14c is connected to: the input 16a of a first control circuit 16, the gating input 18a of a first gated essentially-constant current source 18; and the input of an inverter means 20. The inverter means 20 output provides a $\overline{A}$ signal to the input 22a of a second control circuit 22, and also to the gating input 24a of another gated essentially-constant current source 24.

Gated constant current sources 18 and 24 are connected between a source of positive operating potential +V and one terminal of each of respective integrating capacitors 26 and 28, each having a capacitance $C_I$. The remaining terminal of each of integrating capacitors 26 and 28 is connected to ground potential.

An integrating capacitor discharge means 30 or 32 is connected across the associated one of integrating capacitors 26 or 28, respectively, for discharging the associated capacitor responsive to an associated reset RSTA or $\overline{\text{RSTA}}$ signal, (FIGS. 1e and 1h) respectively. Illustratively, resetting means 30 and 32 are metal-oxide-semiconductor field-effect transistors (MOSFETs) having the drain-source controlled-conduction circuits thereof connected across the associated integrating capacitor, and with the gate electrode thereof receiving the associated resetting signal. The integrator capacitor voltages VA and $\overline{\text{VA}}$ (FIGS. 1f and 1i), respectively, are sampled by means of a series switching device 34 or 36, respectively, connected to one terminal of an associated sampling capacitance 38 or 40, of capacitive value $C_S$. Each of the sampling capacitors 38 and 40 has a remaining terminal connected to ground potential. The sampling devices 34 and 36 are preferably MOSFETs, having a controlled drain-source circuit connected between the nodes at which the respective one of integration voltage VA or $\overline{\text{VA}}$ appears, and the non-grounded terminal of the associated sampling capacitance. Sampling device 34 is rendered conductive by the presence of a first strobe STBA signal (FIG. 1d) at the gate electrode thereof, while sampling device 36 is rendered conductive by the presence of a second strobe $\overline{\text{STBA}}$ signal (FIG. 1g) at the gate electrode thereof. The resulting sampled voltages VHA (across sampling capacitance 38 and shown in FIG. 1k) and $\overline{\text{VHA}}$ (across sampling capacitor 40 and shown in FIG. 1j) are applied to the inputs 42a and 42b, respectively, of a differential amplifier 42. The differential amplifier output 42c voltage is of magnitude related to the difference between the input 42a and 42b voltages, even in the presence of a high common mode voltage therebetween, and is applied through a second-order-loop passive filter 46 (having series resistance 44, a series resistance 46a and a capacitance 46c) to the voltage-controlled oscillator means control input 11b.

In the presently preferred embodiment, the differential amplifier 42 includes first and second MOSFETs 50 and 52, respectively having their gate electrodes connected to respective differential amplifier inputs 42a and 42b. The drain electrodes of devices 50 and 52 are respectively connected through load resistors 54 and 56 to operating potential +V, with the amplifier output 42c being obtained at the junction between the drain electrode of device 52 and the associated load resistor 56. The device 50 and 52 source electrodes are connected together by a gain-setting variable resistance 58, and are each individually connected to a constant-current source 60 via respective source resistances 62 and 64.

Control circuits 16 and 22 provide the alternating reset and alternating strobe signals to the pair of integrator-sampler circuits. The first strobe STBA signal is applied at the negative-going transitions of the A detector-output waveform and the first reset RSTA signal is applied at each positive-going transition thereof. Similarly, the second strobe $\overline{\text{STBA}}$ signal is applied at each negative-going transition of the $\overline{\text{A}}$ waveform and the second reset $\overline{\text{RSTA}}$ pulse is applied at each positive-going transition of the $\overline{\text{A}}$ waveform. That is, the first and second strobe STBA and $\overline{\text{STBA}}$ pulses occur for like, but alternate, transitions of the phase detector output waveform in a first direction and the first and second reset RSTA and $\overline{\text{RSTA}}$ pulses occur for like, but alternate, transitions in the opposite direction (i.e. in phase-quadrature, with respect to the detector input signals).

In the presently preferred embodiment, first and second control means 16 and 22 each include strobe pulse-forming means 66a and 66b, respectively. Each pulse-forming means 66 includes a two-input NAND gate 68a or 68b having a first input connected to the output of an inverter 70a or 70b, each having its input connected to the associated input 16a or 22a of the respective control means. The respective inputs 16a and 22a are respectively connected to the associated input of another inverter 72a or 72b, having its output connected to the associated input of a third inverter 74a or 74b. The input of each of third inverters 74 is connected through a delay capacitance 76a or 76b, a ground potential. The output of the third inverter 74 is connected to the remaining input of NAND gate 68. The output of each gate 68 is connected to the respective clock C input of a first type-D flip-flop logic element 78a or 78b. The D inputs of each flip-flop 78 is connected to the positive operating potential +V (a logic 1 level), as is the D input of each of second flip-flop logic elements 80a and 80b. The $\overline{\text{Q}}$ output of each first flip-flop 78 is connected to the reset R input of the associated second flip-flop 80, in the same control means. The $\overline{\text{Q}}$ output of each second flip-flop 80 is connected to the reset R input of the associated first flip-flop 78. The clock C input of each second flip-flop 80 is connected to the associated control means input 16a or 22a, respectively. The strobe output of each logic means is taken at the output of the associated gate 68, while the reset output of each control means is taken at the $\overline{\text{Q}}$ output of the second flip-flop 80 of that control circuit.

Figure 1B:
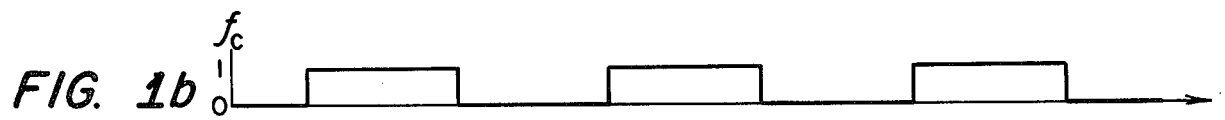
Figure 1C:
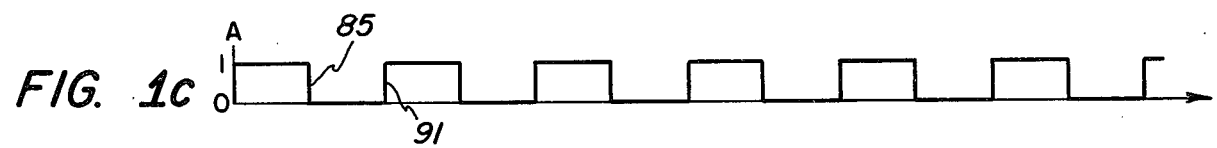
Figure 1D:
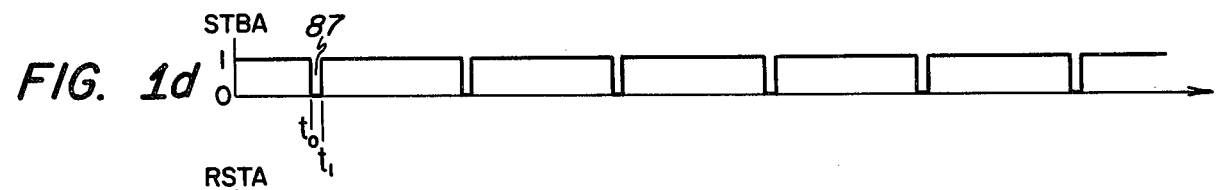
Figure 1E:
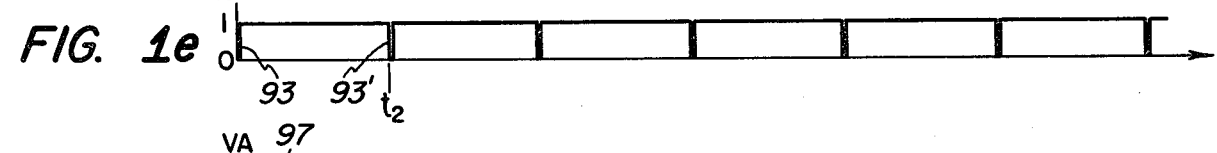

In operation, when the loop 10 is phase-locked, the reference $f_r$ input logic signal is in phase-quadrature with the frequency-divided carrier $f_c$ logic signal, as shown by FIGS. 1a and 1b. The phase detector output 14c waveform is, as previously mentioned, a square wave at twice the reference (or counted-down output) frequency, as shown in FIG. 1c. Pulse-forming network 66a is, prior to an A waveform negative-going transition 85, providing a logic 1 level at gate 68a STBA output. Responsive to negative-going transition 85, the output of inverter 70a immediately goes to a logic 1 level. The output of inverter 72 slowly rises toward a logic 1 level, due to the delay action of capacitor 76. The output of inverter 74 therefore remains at a logic 0 level until some time $t_1$ after the inverter 70 output level has attained the logic 1 level. Accordingly, the STBA output (FIG. 1d) of gate 68 falls to a logic 0 level at time $t_0$, substantially coincident with the negative-going A waveform edge 85, and remains thereat until time $t_1$, when the STBA waveform returns to the logic 1 level. The time interval $t_0$–$t_1$ is established by the value of delay capacitance 76a. Similarly, at each negative-going edge of the $\overline{\text{A}}$ waveform (not shown), the $\overline{\text{STBA}}$ waveform at the output of gate 68b is a negative-going pulse 89 having a pulse width established by the value of the associated delay capacitance 76b. At the next positive-going edge 91 of the A waveform, the Q output of second flip-flop 80a is clocked to the logic 1 level; the $\overline{\text{Q}}$ output thereof falls to a logic 0 level, at time $t_2$ (FIG. 1e). The logic 1 level at the Q output of flip-flop 80a immediately resets the $\overline{Q}$ output of first flip-flop 78a to the logic 1 level, causing second flip-flop 80a to be reset and the $\overline{Q}$ output thereof to quickly return to the logic 1 level. Accordingly, for each positive-going edge 91 of the A waveform, a very narrow negative-going pulse 93 is provided at the RSTA output line of control circuit 16. Similarly, for every positive-going edge of the $\overline{A}$ waveform, a negative-going, very narrow pulse 95 is provided at the RST$\overline{A}$ output of control circuit 22 (FIG. 1h).

Figure 1F:
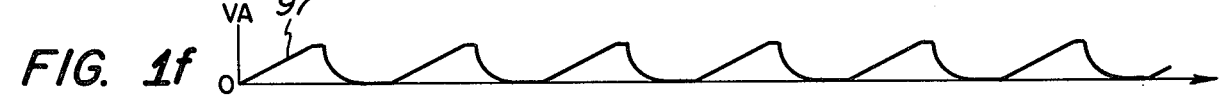
Figure 1G:
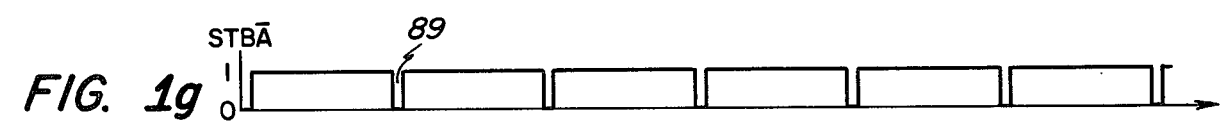
Figure 1H:
Figure 1I:
Figure 1J:
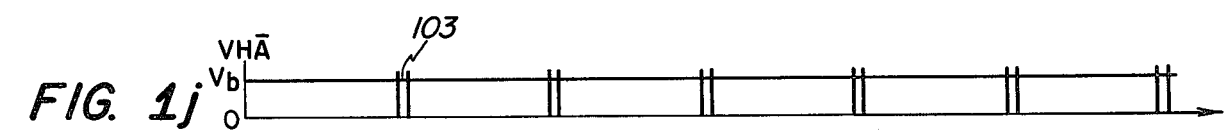
Figure 1K:

Responsive to each RSTA negative-going narrow pulse, device 30 is placed in the conductive condition for the duration thereof, whereby the associated integrating capacitor 26 is discharged (FIG. 1f). When the pulse 93 terminates, and reverts to the logic 1 level, discharge device 30 is in the cut-off condition. Further, at the termination of the RSTA pulse 93, waveform A is at the logic 1 level at gated current source input 18a. Gated constant current source 18 is turned on and a constant current $I_1$ flows into the integrating capacitance; and a substantially linearly-increasing voltage ramp 97, of magnitude determined by the constant source current $I_1$ and the integrating capacitance value $C_I$, commences. The integrating capacitance voltage VA linearly increases until a strobe STBA pulse 87 thereafter occurs. The strobe STBA pulse causes device 34 to conduct, sampling the VA voltage as the VHA voltage across sampling capacitance 38. Simultaneously therewith, the A waveform returns to the logic 0 level, cutting off current flow from constant current source 18. At the end of the strobe STBA pulse 87, integrating capacitor 26 may lose charge and the voltage VA across it is eventually reset to essentially zero with the next RSTA pulse 93', whereupon the integrate-and-sample cycle again begins.

The $\overline{A}$ waveform, in conjunction with the RST$\overline{A}$ waveform and the STB$\overline{A}$ waveform cause a similar integrate-and-sample cycle to occur with respect to second integrating capacitor 28. Thus, the V$\overline{A}$ voltage is reset to a substantially zero magnitude by a first RST$\overline{A}$ pulse 95; thereafter, current source 24 is turned on by the $\overline{A}$ waveform being at the logic 1 level and a linearly-increasing ramp waveform 99 is provided. The next STB$\overline{A}$ pulse 89 samples waveform 99, and the integration capacitor voltage is eventually reset at the next subsequent RST$\overline{A}$ negative-going pulse 95'.

During each sampling time, the VHA voltage load 101 is at a first value $V_a$, due to sampling by pulse 87, while the VH$\overline{A}$ voltage is sampled, by the STB$\overline{A}$ pulse 89, to a $V_b$ level in interval 103, at a time equal to one-quarter of the reference frequency thereafter. The two sampled voltages VHA and VH$\overline{A}$ are respectively coupled to the two inputs 42a and 42b, respectively, of differential amplifier 42. If the loop is locked, with $f_0 = N \times f_r$, and if the two integrators have identical time constants, the sampled voltages will be identical $V_a = V_b$, and the control voltage at control input 11b will be of zero magnitude. As the integrator time constants can be made equal, even if the values of integration capacitors 26 and 28 are slightly different, by adjustment of the current magnitudes of gated sources 18 and 24, the oscillator 11 output frequency can be adjusted for lock condition with an initial zero control voltage input and thereafter be maintained and locked by loop 11. Thus, if either the reference frequency or the oscillator frequency changes, the frequencies are no longer in phase-quadrature and waveforms A and $\overline{A}$ are not exactly square waves. As the STBA and RSTA pulses essentially occur for each transition of the counted-down $f_c$ waveform and the STB$\overline{A}$ and RST$\overline{A}$ pulses occur for each transition of the reference $f_r$ waveform, any frequency difference between $f_r$ and $f_c$ causes one or the other of ramps 97 or 99 to be provided for a greater time interval prior to sampling. Therefore, the longer time interval will allow the associated ramp to integrate to a higher voltage, whereby $V_a$ is not equal to $V_b$, and the voltage at differential amplifier output 42c will have a commensurate (error) voltage change. This change in error voltage will control the frequency of voltage-control oscillator means 11 to increase or decrease, as necessary, to bring the frequency-divided oscillator output $f_c$ into frequency synchronization with the reference frequency $f_r$. Because the integrating capacitors 26 and 28 and the sampling capacitors 38 and 40 may have relatively small values, large capacitors are not necessary in loop 10 and the stability of the system is relatively uneffected by the small capacitive values present. The ripple normally present in the typical phase-locked loop, due to the twice-reference-frequency square wave at the output of the phase detector, is drastically reduced (and ideally absent if the two integrator-and-sample channels are identical) when the loop is synchronized.

While the present invention has been described with respect to a presently preferred embodiment, many modifications and variations will now become apparent to those skilled in the art. It is my intent, therefore, to be limited only by the scope of the appending claims and not by the details and instrumentalities described by way of example herein.

What is claimed is:

1. A phase-locked loop providing an output frequency locked to a multiple N of a reference frequency, comprising:

oscillator means for providing an output signal at a frequency determined by the magnitude of a control voltage at a control input of said oscillator means;

means for dividing said output signal frequency by said multiple N to provide a divided frequency signal;

phase detector means for providing a binary error signal responsive to a phase difference between said divided frequency signal and said reference frequency;

control means for providing a first reset signal and a second strobe signal responsive to each transition of said error signal in a first direction, and for providing a second reset signal and a first strobe signal responsive to each transition of said error signal in the remaining direction;

first and second integrator means each for generating at a respective output thereof a respective ramp waveform each commencing responsive respectively to a respective associated one of said first and second reset signals;

first and second means for sampling the magnitude of said respective ramp waveform from the output of the associated one of said first and second integrator means responsive respectively to a respective one of said first and second strobe signals; and differential amplifier means for providing said control voltage to said oscillator means control input responsive to the difference in said sampled ramp waveform magnitudes provided by said first and second sampling means.

2. The phase-locked loop of claim 1, wherein said phase detector means includes an exclusive-OR gate having a first input connected to receive the signal at said reference frequency; a second input connected to receive said divided frequency signal, and an output at which said error signal is provided responsive to said signals at said first and second inputs.

3. A phase-locked loop of claim 1, wherein said first and second integrator means each include; an integration capacitor; means for discharging said integration capacitor responsive to the associated one of said first and second reset signals; and gated current source means for providing a substantially constant flow of current into said integration capacitor only when said error signal is in one binary state; said gated current source means of said first and second integrator means being operative responsive to different ones of said error signal binary states.

4. The phase-locked loop of claim 3, wherein said discharging means includes a switching device forming respective high and low impedances across the associated integration capacitor responsive respectively to the absence and presence of the associated reset signal.

5. The phase-locked loop of claim 4, wherein each switching device is a metal-oxide semiconductor field-effect transistor.

6. The phase-locked loop of claim 1, wherein said first and second sampling means each include: a sampling capacitor; and means for coupling said ramp waveform output signal from the associated one of said integrating means to said sampling capacitor only when the associated one of said strobe signals is present.

7. The phase-locked loop of claim 6, wherein each coupling means includes a switching device forming respective high and low impedances between said sampling capacitance and the associated integrating means output responsive respectively to the absence and presence of said associated strobe signal.

8. The phase-locked loop of claim 7, wherein each switching device is a metal-oxide semiconductor field-effect transistor.

9. The phase-locked loop of claim 1, wherein said differential amplifier has high input impedance and a presettable gain.

10. The phase-locked loop of claim 9, wherein said differential amplifier means includes: first and second MOSFET devices, each having a drain electrode, a source electrode, and a gate electrode connected to receive the sampled signal from the associated one of said first and second sampling means; a substantially-constant current source; first and second resistors each connected between said current source and said source electrode of a respective one of the first and second MOSFETs; a gain-setting variable resistance connected between the source electrodes of said first and second MOSFETs; a source of operating potential; and first and second load resistors each connected between said operating potential source and the drain electrode of the associated one of said first and second MOSFETs; the differential amplifier means output being formed at a selected drain electrode.

11. The phase-locked loop of claim 1, wherein said control means includes: means for inverting the logic state of the error signal to provide an inverted-state error signal; and first and second control circuits each including: means for forming a fixed duration strobe signal pulse responsive to a transition in a first direction of a respective one of said error signal and said inverted-state error signal; and means for forming an associated one of said first and second reset signals responsive to each transition in the second direction of the associated one of said error signal and said inverted-state error signal.

12. The phase-locked loop of claim 11, wherein each of said strobe signal pulse forming means includes: a NAND gate having first and second inputs and an output; first and second inverters each having an input connected to the associated one of said error signal and said inverted-state error signal, an output of said first inverter being connected to one of said gate inputs; a third inverter having an input connected to the output of the second inverter and an output connected to the remaining gate input; and a delay capacitor connected to the output of said second inverter and having a capacitance selected to provide the desired fixed duration to the pulse formed at the gate output responsive to said first direction transition of the signal at the pulse-forming means input.

13. The phase-locked loop of claim 12, wherein each of said reset signal forming means includes: first and second flip-flops each having a clock input, a reset input, a logic-true output and a logic-false output; each first flip-flop clock input receiving the associated strobe pulse from the same control circuit, each second flip-flop clock input receiving that one of the error signal and inverted-state error signal supplied to the input of that control circuit; the reset input of said first flip-flop being coupled to the logic-true output of said second flip-flop; the reset input of said second flip-flop being coupled to the logic-false output of said first flip-flop; and the associated reset signal being provided at the second flip-flop logic-false output.

14. The phase-locked loop of claim 1, wherein said loop is a second-order loop and further includes a passive resistive-capacitive filter connected between said differential amplifier means and said oscillator means control input.

* * * * *